United States Patent
Liu et al.

(10) Patent No.: US 12,295,241 B2
(45) Date of Patent: May 6, 2025

(54) OPTICAL ADJUSTMENT METHOD OF COLOR FILM LAYER, DISPLAY PANEL, AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventors: Jing Liu, Wuhan (CN); Jing Zhou, Wuhan (CN)

(*) Notice: Subject to any disclaimer, the term of this patent is extended or adjusted under 35 U.S.C. 154(b) by 0 days.

(21) Appl. No.: 17/623,286

(22) PCT Filed: Dec. 22, 2021

(86) PCT No.: PCT/CN2021/140297
§ 371 (c)(1),
(2) Date: Dec. 28, 2021

(87) PCT Pub. No.: WO2023/108741
PCT Pub. Date: Jun. 22, 2023

(65) Prior Publication Data
US 2024/0040907 A1   Feb. 1, 2024

(30) Foreign Application Priority Data
Dec. 16, 2021 (CN) .......................... 202111544928.2

(51) Int. Cl.
*H10K 59/80* (2023.01)
*G02B 5/20* (2006.01)
*H10K 59/35* (2023.01)

(52) U.S. Cl.
CPC .......... *H10K 59/875* (2023.02); *H10K 59/35* (2023.02); *G02B 5/201* (2013.01)

(58) Field of Classification Search
CPC . G02F 1/133603; H10K 59/875; H10K 59/35
See application file for complete search history.

(56) References Cited

U.S. PATENT DOCUMENTS

2006/0274232 A1   12/2006 Hsieh
2011/0156575 A1   6/2011 Yu et al.

FOREIGN PATENT DOCUMENTS

| CN | 101038397 A | 9/2007 |
|---|---|---|
| CN | 103106847 A | 5/2013 |
| CN | 109116615 A | 1/2019 |
| CN | 112859224 A | 5/2021 |

(Continued)

OTHER PUBLICATIONS

Chinese Office Action issued in corresponding Chinese Patent Application No. 202111544928.2 dated Oct. 12, 2024, pp. 1-7.

*Primary Examiner* — Mariceli Santiago

(57) ABSTRACT

An optical adjustment method of a color film layer, a display panel, and a mobile terminal are provided by the present application. The display panel includes a plurality of pixel units, each pixel unit is disposed in a hexagon, wherein the hexagon is divided into six triangles around a center the hexagon. One pixel structure includes six closely-arranged pixel units. One pixel unit is correspondingly disposed in one triangle. In a pixel unit and a corresponding triangle, the pixel unit includes three sub-pixels which are respectively disposed at three vertex corners of the triangle and have different colors.

14 Claims, 5 Drawing Sheets

(56) References Cited

FOREIGN PATENT DOCUMENTS

| | | | |
|---|---|---|---|
| CN | 113097281 A | 7/2021 | |
| KR | 20170064606 A | 6/2017 | |
| WO | WO-2021213033 A1 * | 10/2021 | ....... G02F 1/133504 |

* cited by examiner

OPTICAL ADJUSTMENT METHOD OF COLOR FILM LAYER, DISPLAY PANEL, AND MOBILE TERMINAL

The present application relates to display technologies, and more particularly, to an optical adjustment method of a color film layer, a display panel, and mobile terminal.

BACKGROUND OF INVENTION

In an organic light-emitting diode (OLED) display panel, a polarizer can effectively reduce a reflectivity of the panel under strong light, but it loses nearly 58% of the light output. This greatly increases a life burden of OLED display panels.

At present, in the currently display panels, a color filter (CF) is usually used to replace a polarizer to solve the above problems. The display panel using color film technology can not only realize a lightness and a thinness of the display panel, but also improve a light output rate of the display panel from 42% to 60%, and also improve a contrast of the display panel.

However, a use of the color film layer not only affects a reflectivity of the display panel, but also affect a light extraction efficiency of the pixel unit of the organic light-emitting layer because of its characteristics. Therefore, it is very important to define a spectrum that matches the color film layer and the organic light-emitting layer and meets reflectivity requirements of the display panel.

SUMMARY OF INVENTION

The embodiments of the present application provide an optical adjustment method of a color film layer, a display panel, and a mobile terminal, which are configured to improve a luminous efficiency of the display panel and improve an optical quality and taste of the display panel.

In order to achieve the above effects, one embodiment of the present application provides a display panel, including:
  a light-emitting functional layer including a plurality of light-emitting units arranged at intervals: and
  a color film layer disposed on the light-emitting function layer, wherein the color film layer includes a plurality of color resists arranged at intervals, and wherein one of the color resists and one of the light-emitting units are arranged in alignment;
  wherein in one of the light-emitting units and a corresponding one of the color resists; an absolute value of a difference between a peak value of a transmission spectrum of the color resist and a peak value of a luminescence spectrum of the corresponding light-emitting unit is less than or equal to 10 nanometers, and a difference between a half width of a transmission spectrum of the color resist and a half width of the luminescence spectrum of the corresponding light-emitting unit is greater than or equal to 10 nanometers.

In the display panel provided by one embodiment of the present application, the light-emitting function layer includes a red light-emitting unit, and wherein the color film layer includes a red resist arranged in alignment with the red light-emitting unit; and wherein a peak wavelength of the transmission spectrum of the red resist is greater than 600 nanometers.

In the display panel provided by one embodiment of the present application, the light-emitting function layer includes a green light-emitting unit; and wherein the color film layer includes a green resist arranged in alignment with the green light-emitting unit, and wherein a peak wavelength of the transmission spectrum of the green resist ranges from 507 nanometers to 547 nanometers.

In the display panel provided by one embodiment of the present application, the light-emitting function layer includes a blue light-emitting unit, and wherein the color film layer includes a blue color resist arranged in alignment with the blue light-emitting unit; and wherein a peak wavelength of the transmission spectrum of the blue color resist ranges from 440 nanometers to 480 nanometers.

In the display panel provided by one embodiment of the present application, a transmittance of the color resist ranges from 44.3% to 65%.

In the display panel provided by one embodiment of the present application; a transmittance of the color resist is 58%.

In the display panel provided by one embodiment of the present application, a half-width of the color resist is less than 150 nanometers.

The embodiment of the present application also provides an optical adjustment method of a color film layer, wherein when applied to a display panel including a light-emitting function layer, and wherein the color film layer disposed on the light-emitting function layer, and wherein the light-emitting function layer includes a plurality of light-emitting units arranged at intervals, and wherein the color film layer includes a plurality of color resists arranged at intervals, and wherein one of the color resists and one of the light-emitting units are arranged in alignment;
  in one of the light-emitting units and a corresponding one of the color resists, the optical adjustment method of the color film layer including the following steps:
  acquiring a luminescence spectrum of the light-emitting unit;
  setting a first threshold value and a second threshold value;
  determining a peak value of the transmission spectrum according to a peak value of the luminescence spectrum and the first threshold value, and wherein the first threshold value is 10 nanometers;
  determining a half-width of the transmission spectrum according to the half-width of the luminescence spectrum and the second threshold value, wherein the second threshold value is 10 nanometers; and
  determining the transmission spectrum according to the peak value of the transmission spectrum and the half-width of the transmission spectrum, to make a range of the luminescence spectrum of the light-emitting unit within a range of a transmission spectrum of the color resist.

In the optical adjustment method of the color film layer provided by one embodiment of the present application, in one of the light-emitting units and the corresponding one of the color resists, the optical adjustment method of the color film layer further includes
  acquiring a preset rated power consumption of the display panel, a reflectivity threshold value of the color resist, and an actual reflectivity value of the light-emitting unit, determining a transmittance of the color resist according to the preset rated power consumption of the display panel, the reflectivity threshold value of the color resist, and the actual reflectivity value of the light-emitting unit.

In the optical adjustment method of the color film layer provided by one embodiment of the present application, the step of acquiring a preset rated power consumption of the display panel, a reflectivity threshold value of the color resist, and an actual reflectivity value of the light-emitting unit, determining the transmittance of the color resist according to the preset rated power consumption of the display panel, the reflectivity threshold value of the color resist, and the actual reflectivity value of the light-emitting unit includes:

determining a minimum transmittance of the color resist according to the preset rated power consumption of the display panel; and determining a maximum transmittance of the color resist according to the reflectivity threshold value of the color resist and the actual reflectivity value of the light-emitting unit.

In the optical adjustment method of the color film layer provided by one embodiment of the present application, the minimum transmittance of the color resist is determined according to the following relational expression (1) and relational expression (2):

$$T_1 = \frac{K}{P_1} \quad (1)$$

$$P_1 < M \quad (2)$$

wherein $T_1$ is the minimum transmittance of the color resist, K is a constant, $P_1$ is a power consumption of the display panel, and M is the preset rated power consumption of the display panel.

In the optical adjustment method of the color film layer provided by the embodiment of the present application, further determining the maximum transmittance of the color resist according to the following relational expression (3), relational expression (4), and relational expression (5):

$$T_3 = \sqrt{\frac{r}{R_1 \cdot S}} \quad (3)$$

$$T_3 = \sqrt{\frac{r}{R_1 \cdot S}} \quad (4)$$

$$T_2 = \frac{\int (F_1 \cdot T_3)}{\int F_1} \quad (5)$$

wherein $T_2$ is the maximum transmittance of the color resist, r is a reflectivity of the color resist, $R_1$ is an actual reflectivity of the light-emitting unit, and $T_3$ is a transmittance of the color resist in a preset wavelength band, S is a human visual function, $R_2$ is the reflectivity threshold value of the color resist, and $F_1$ is a luminescence intensity of the preset wavelength band of the light-emitting unit.

In the optical adjustment method of the color film layer provided by the embodiment of the present application, the transmittance of the color resist ranges from 44.3% to 65%.

One embodiment of the present application provides a mobile terminal, wherein the mobile terminal includes a terminal body and a display panel, and wherein the terminal body and the display panel are combined into one body, and wherein the display panel includes:

a light-emitting functional layer including a plurality of light-emitting units arranged at intervals; and a color film layer disposed on the light-emitting function layer, wherein the color film layer includes a plurality of color resists arranged at intervals, and wherein one of the color resists and one of the light-emitting units are arranged in alignment;

wherein in one of the light-emitting units and a corresponding one of the color resists, an absolute value of a difference between a peak value of a transmission spectrum of the color resist and a peak value of a luminescence spectrum of the corresponding light-emitting unit is less than or equal to 10 nanometers, and a difference between a half width of a transmission spectrum of the color resist and a half width of the luminescence spectrum of the corresponding light-emitting unit is greater than or equal to 10 nanometers.

In the mobile terminal provided by one embodiment of the present application, the light-emitting functional layer includes a red light-emitting unit, and wherein the color film layer includes a red resist arranged in alignment with the red light-emitting unit, and wherein a peak wavelength of the transmission spectrum of the red resist is greater than 600 nanometers.

In the mobile terminal provided by one embodiment of the present application, the light-emitting function layer includes a green light-emitting unit, and wherein the color film layer includes a green resist arranged in alignment with the green light-emitting unit, and wherein a peak wavelength of the transmission spectrum of the green resist ranges from 507 nanometers to 547 nanometers.

In the mobile terminal provided by one embodiment of the present application, the light-emitting function layer includes a blue light-emitting unit, and wherein the color film layer includes a blue color resist arranged in alignment with the blue light-emitting unit, and wherein a peak wavelength of the transmission spectrum of the blue color resist ranges from 440 nanometers to 480 nanometers.

In the mobile terminal provided by one embodiment of the present application, a transmittance of the color resist ranges from 44.3% to 65%.

In the mobile terminal provided by one embodiment of the present application, the transmittance of the color resist is 58%.

In the mobile terminal provided by the embodiment of the present application, a half-width of the color resist is less than 150 nanometers.

Beneficial effects of the embodiments of the present application: The embodiments of the present application provide an optical adjustment method of a color film layer, a display panel, and a mobile terminal. The display panel includes a light-emitting function layer and a color film layer disposed on the light-emitting layer. The light-emitting function layer includes a plurality of light-emitting units arranged at intervals. The color film layer includes a plurality of color resists arranged at intervals. One of the color resists and one of the light-emitting units are arranged in alignment. In one of the light-emitting units and a corresponding one of the color resists, an absolute value of a difference between a peak value of a transmission spectrum of the color resist and a peak value of a luminescence spectrum of the corresponding light-emitting unit is less than or equal to 10 nanometers, and a difference between a half width of a transmission spectrum of the color resist and a half width of the luminescence spectrum of the corresponding light-emitting unit is greater than or equal to 10 nanometers, so that most of the light emitted by the organic light-emitting layer can pass through the color film layer. Thereby improving a luminous efficiency of the display panel, and improving an optical quality and taste of the display panel.

DESCRIPTION OF FIGURES

The following detailed description of the specific implementations of the present application in conjunction with the accompanying figures will make the technical solutions and other beneficial effects of the present application obvious.

DETAILED DESCRIPTION OF EMBODIMENTS

This application provides an optical adjustment method of a color film layer, a display panel, and a mobile terminal. In order to make the objectives, technical solutions, and effects of the present application clearer and more specific, the present application will be further described in detail below with reference to the figures and embodiments. It should be understood that the specific embodiments described here are only used to explain the present application, and are not used to limit the present application.

Figure 1:
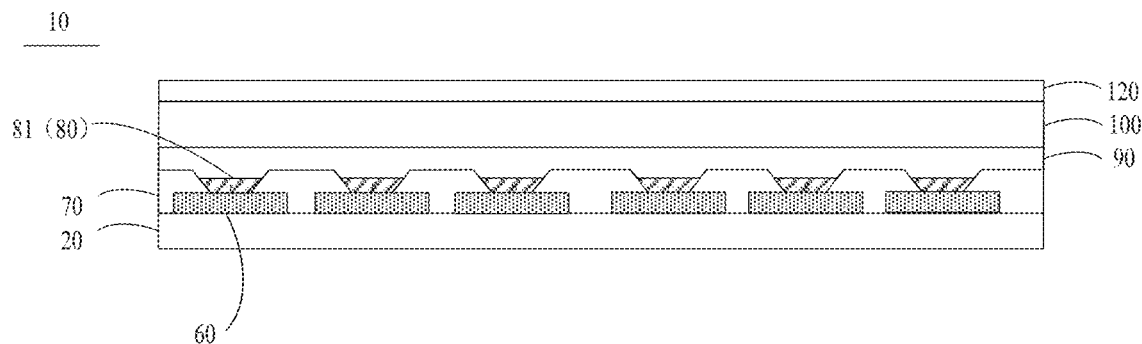
FIG. 1 is a schematic diagram of a structure of a currently display panel.

Please refer to FIG. 1, which is a schematic diagram of a structure of a currently display panel.

The display panel 10 includes a substrate 20, a first metal layer 60, a pixel definition layer 70, an organic light-emitting layer 80, a second metal layer 90, an encapsulation layer 100, and a polarizer 120 which are stacked and arranged. The polarizer can effectively reduce a reflectivity of the display panel 10 under strong light, but close to 58% of the light is lost. This greatly increases a life-span burden of the display panel 10. Currently, in the prior art, usually a color filter (CF) is configured to replace the polarizer 120 to solve the above problems.

The color film layer is usually composed of a red color resist, a green color resist, a blue color resist and a black matrix. In the display panel, the red color resist, the green color resist, and the blue color resist respectively responsible the light output of R/G/B sub-pixel units corresponding to the organic light-emitting layer. The black matrix is mainly responsible for preventing the light leakage of the display panel and reducing a reflection of the display panel.

However, the color film layer is usually disposed on a side of a light-emitting direction of the OLED panel, wherein the color film layer affects a reflectivity of the display panel, and wherein spectral characteristic of the color film layer affect light-emitting from the R/G/B sub-pixel units of the organic light-emitting layer. Therefore, it is very important to define a spectrum that matches the R/G/B color resist of the color film layer and the R/G/B sub-pixels of the organic light-emitting layer, to meet the reflectivity requirements of the display panel. Based on this, the embodiments of the present application provide an optical adjustment method of the color film layer and a display panel, which are used to improve a luminous efficiency of the display panel and improve the optical quality and taste of the display panel.

Please refer to FIGS. 2 to 9, the present application provides an optical adjustment method of a color film layer and a display panel. The display panel includes a light-emitting function layer including a plurality of light-emitting units arranged at intervals, and a color film layer disposed on the light-emitting functional layer, wherein the color film layer includes a plurality of color resists arranged at intervals, and wherein one of the color resists and one of the light-emitting units are arranged in alignment. In one of the light-emitting units and a corresponding one of the color resists, an absolute value of a difference between a peak value of a transmission spectrum of the color resist and a peak value of a luminescence spectrum of the corresponding light-emitting unit is less than or equal to 10 nanometers, and a difference between a half width of a transmission spectrum of the color resist and a half-width of the luminescence spectrum of the corresponding light-emitting unit is greater than or equal to 10 nanometers.

It is understandable that, in the present application, the light-emitting unit 800 and the corresponding one of the color resists 111 are provided. A difference between a peak value of a transmission spectrum of the color resist 111 and a peak value of a luminescence spectrum of the corresponding light-emitting unit 800 is less than or equal to 10 nanometers. A difference between a half width of the transmission spectrum of the color resist 111 and a half-width of the luminescence spectrum of the corresponding light-emitting unit 800 is greater than or equal to 10 nanometers. Therefore, most of the light emitted by the light-emitting unit 800 can pass through the color film layer 110, thereby improving a light-emitting efficiency of the display panel 10, and thereby improving an optical quality and taste of the display panel 10.

The technical solution of the present application will now be described in conjunction with specific embodiments.

Figure 2:
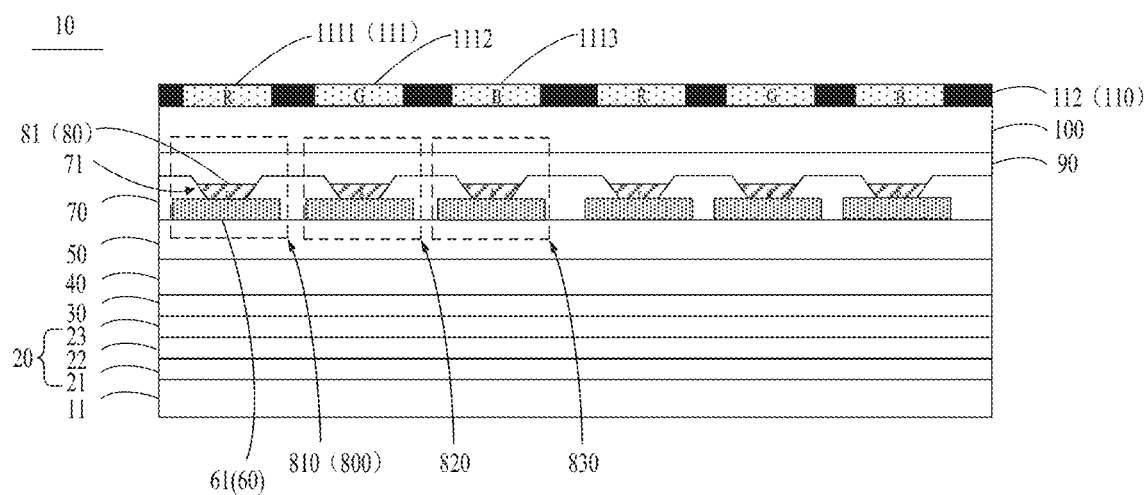
FIG. 2 is a schematic diagram of the structure of the display panel provided by one embodiment of the present application.
Figure 3:
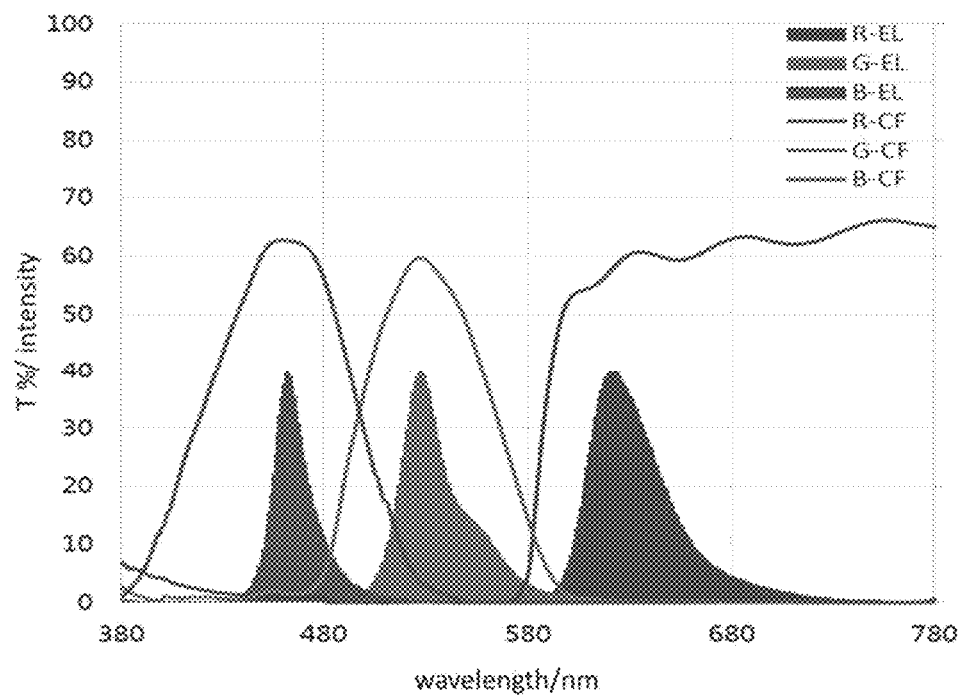
FIG. 3 is a coordinate diagram of a luminescence spectrum of the organic light-emitting layer and a transmission spectrum of the color film layer of the display panel provided by one embodiment of the present application.

Please combine FIG. 2 and FIG. 3, wherein FIG. 2 is a schematic diagram of the structure of the display panel provided by one embodiment of the present application, FIG. 3 is a coordinate diagram of the luminescence spectrum of the organic light-emitting layer and the transmission spectrum of the color film layer of the display panel provided by one embodiment of the present application.

This embodiment provides a display panel 10, which includes, but is not limited to, an organic light-emitting diode (OLED) panel 10, which is not specifically limited in this embodiment. It should be noted that, in this embodiment, the display panel 10 is the organic light-emitting diode display panel 10 as an example to describe the technical solution of the present application.

In this embodiment, the display panel 10 includes a glass substrate 11, a base substrate 20, a buffer layer 30, an array substrate 40, a planarization layer 50, a first metal layer 60, a pixel definition layer 70, an organic light-emitting layer 80, a second metal layer 90, an encapsulation layer 100, and a color film layer 110.

The base substrate 20 includes a first substrate 21, a spacer layer 22, and a second substrate 23 that are sequentially stacked. The first substrate 21 and the second substrate 23 may each include a rigid substrate or a flexible substrate. A material of the first substrate 21 and the second substrate 23 may be metal or glass when the first substrate 21 and the second substrate 23 are rigid substrates. The material of the first substrate 21 and the second substrate 23 may include at least one of acrylic resin, methacrylic resin, polyisoprene, vinyl resin, epoxy-based resin, polyurethane-based resin, cellulose resin, siloxane resin, polyimide-based resin, polyimide-based resin when the first substrate 21 and the second substrate 23 are flexible substrates. A material of the spacer layer 22 includes, but is not limited to, materials with water absorption properties such as silicon nitride (SiNx) and silicon oxide (SiOx). The materials of the first substrate 21, the second substrate 23, and the spacer layer 22 are not limited in the present application.

A material of the first metal layer 60 and the second metal layer 90 both include at least one OF molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta) and tungsten (W) metal. In this embodiment, the materials of the first metal layer 60 and the second metal layer 90 are not specifically limited in the present application.

It should be noted that in this embodiment, the first metal layer 60 includes a plurality of first electrodes 61 arranged at intervals, the second metal layer 90 includes a second electrode 91, and the first electrode 61 includes but not limited to an anode, the second electrode 91 includes but is not limited to a cathode layer. In this embodiment, the first electrode 61 is an anode and the second electrode 91 is a cathode layer as an example to describe the technical solution of the present application.

In this embodiment, the pixel definition layer 70 includes a plurality of opening regions 71 exposing a portion of the electrode, and the organic light-emitting layer 80 is positioned in the opening region 71, Specifically, the organic light-emitting layer 80 includes a plurality of sub-pixels 81 of different colors are arranged at intervals, one of the sub-pixels 81 is correspondingly arranged in one of the opening regions 71, and one of the sub-pixels 81 is arranged corresponding to one of the first electrodes 61, wherein the sub-pixels 81 includes, but is not limited to, a red sub-pixel r, a green sub-pixel g, and a blue sub-pixel b.

In this embodiment, the organic light-emitting layer 80 further includes a plurality of light-emitting units 800 arranged at intervals, and wherein each of the light-emitting units 800 includes a first electrode 61, a sub-pixel 81, and a second electrode 91. The color film layer 110 includes a plurality of color resists 111 and a plurality of black matrixes 112 arranged at intervals, wherein one of the color resists 111 corresponds to one of the light-emitting units 800. Each of the black matrixes 112 is positioned in between of the color resists 111, to define the boundaries between the color resists 111. Further, in order to prevent light leakage between adjacent color resists 111, the edges of the color resists 111 are usually overlapped with the black matrixes 112.

Specifically, in one light-emitting unit 800 and a corresponding one of the color resists 111, an absolute value of a difference between a peak value of a transmission spectrum of the color resist 111 and a peak value of a luminescence spectrum of the corresponding light-emitting unit 800 is less than or equal to a first preset value. Preferably, the first preset value is 10 nanometers: a difference of between a half-width of the transmission spectrum of the color resist and a half width of the luminescence spectrum of the corresponding light-emitting unit is greater than or equal to a second preset value. Preferably, the second preset value is 10 nanometers. Therefore, it can be understood that the transmission spectrum of the color resist 111 is relatively close to the luminescence spectrum of the corresponding light-emitting unit 800 when a relationship between the transmission spectrum of the color resist 111 and the luminescence spectrum of the corresponding light-emitting unit 800 meets the above-mentioned requirements of the peak value and the half-width, so that most of the light emitted by the organic light-emitting layer 80 can pass through the color film layer 110, thereby improving the luminous efficiency of the display panel 10. It should be noted that, in FIG. 3, the above-mentioned peak refers to the wavelength peak of the horizontal axis, and the above-mentioned half-width refers to the wavelength half-width of the horizontal axis. At the same time, the ordinate in FIG. 3 corresponds to the transmittance of the transmission spectrum and the luminescence intensity of the luminescence spectrum.

Figure 4:
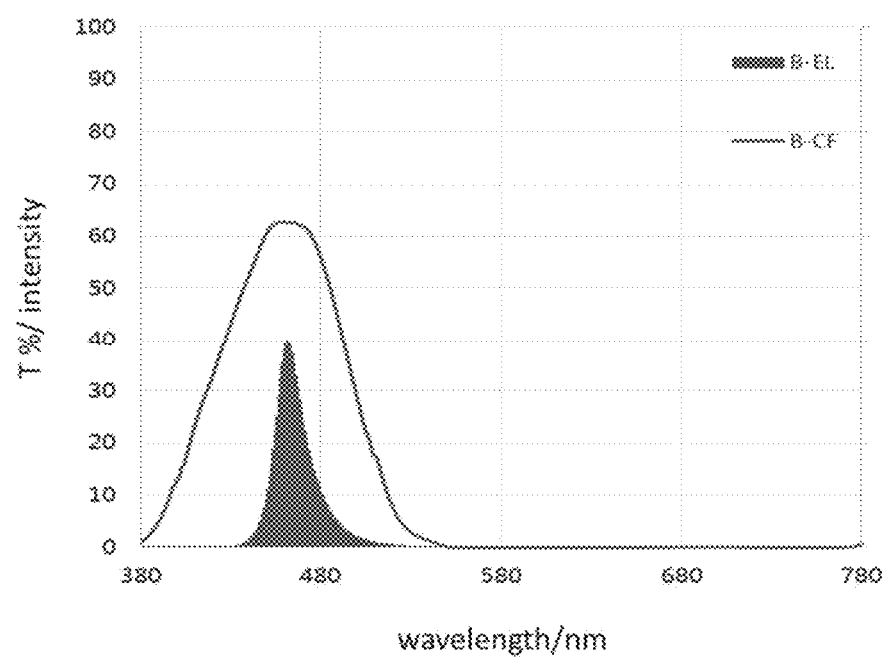
FIG. 4 is a comparison diagram of a transmission spectrum of a blue color resist of the color film layer and a luminescence spectrum of a blue light-emitting unit of the organic light-emitting layer provided by one embodiment of the present application.
Figure 5:
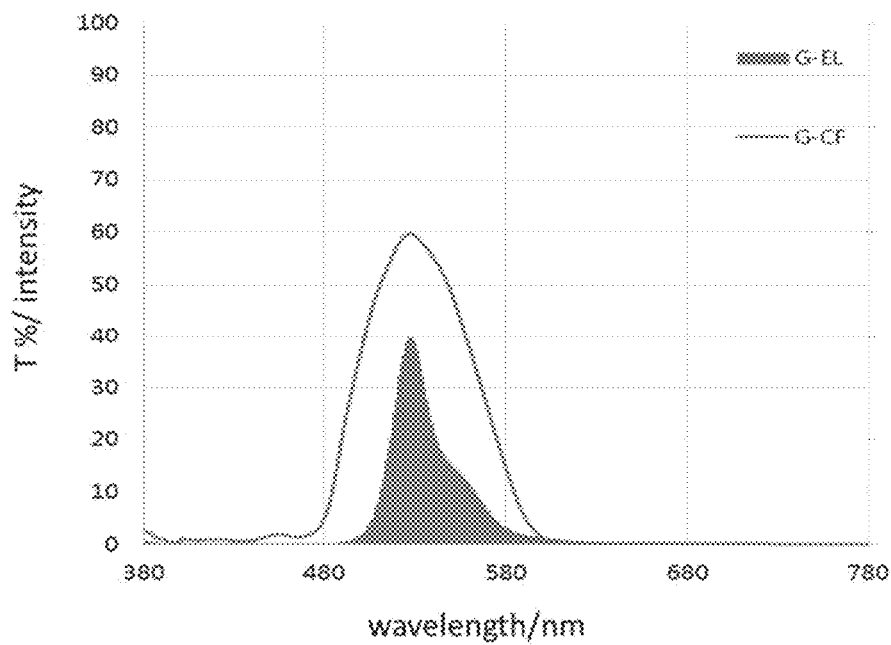
FIG. 5 is a comparison diagram of a transmission spectrum of a green color resist of the color film layer and a luminescence spectrum of the green light-emitting unit of the organic light-emitting layer provided by one embodiment of the present application.
Figure 6:
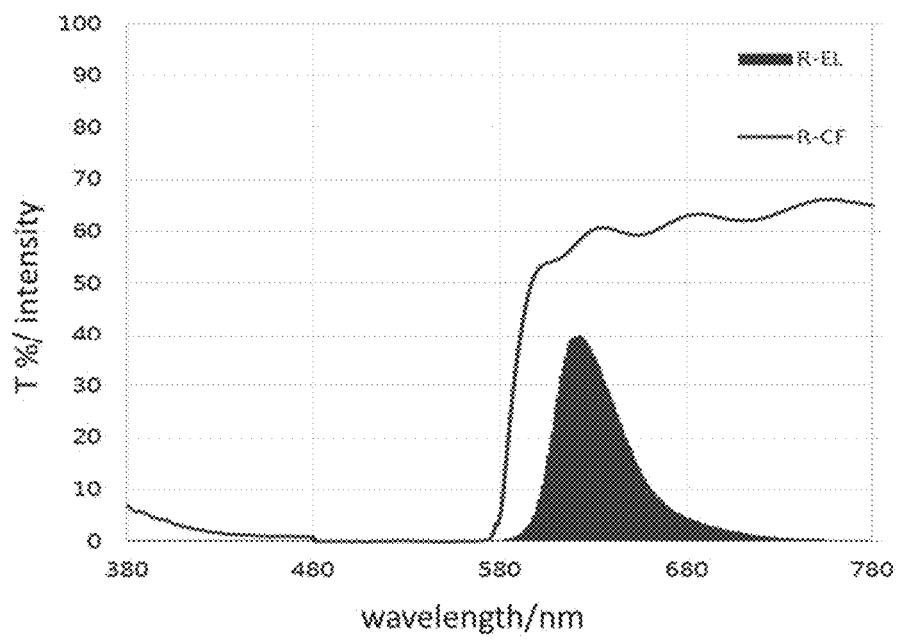
FIG. 6 is a comparison diagram of a transmission spectrum of a red color resist of the color film layer and a luminescence spectrum of the red light-emitting unit of the organic light-emitting layer provided by one embodiment of the present application.

Further, please combine FIGS. 2, 4, 5 and 6, wherein FIG. 4 is a comparison diagram of a transmission spectrum of a blue color resist of the color film layer and a luminescence spectrum of a blue light-emitting unit of the organic light-emitting layer provided by one embodiment of the present application, FIG. 5 is a comparison diagram of a transmission spectrum of a green color resist of the color film layer and a luminescence spectrum of the green light-emitting unit of the organic light-emitting layer provided by one embodiment of the present application, and FIG. 6 is a comparison diagram of a transmission spectrum of a red color resist of the color film layer and a luminescence spectrum of the red light-emitting unit of the organic light-emitting layer provided by one embodiment of the present application.

In this embodiment, the light-emitting unit 800 includes at least a red light-emitting unit 810, a green light-emitting unit 820, and a blue light-emitting unit 830. The color film layer 110 is positioned above the organic light-emitting layer 80. The color resist 111 is at least includes a red color resist 1111, a green color resist 1112, and a blue color resist 1113, wherein the red color resist 1111 is disposed corresponding to the red light-emitting unit 810, the green color resist 1112 is disposed correspondingly to the light-emitting unit 800, and wherein the blue color resist 1113 is disposed corresponding to the blue light-emitting unit 830.

An orthographic projection of the red color resist 1111 in a direction perpendicular to the display panel 10 covers an orthographic projection of the red sub-pixel r in the direction perpendicular to the display panel 10. An orthographic projection of the green color resist 1112 in the direction perpendicular to the display panel 10 covers an orthographic projection of the green sub-pixel g in the direction perpendicular to the display panel 10. An orthographic projection of the blue color resist 1113 in the direction perpendicular to the display panel 10 covers an orthographic projection of the blue sub-pixel b in the direction perpendicular to the display panel 10. In this way, the visual aesthetic effect of the display panel 10 being integrated black is realized.

In this embodiment, a peak wavelength of the transmission spectrum of the blue color resist 1113 ranges from 440 nanometers to 480 nanometers.

A peak wavelength of the transmission spectrum of the green color resist 1112 ranges from 507 nanometers to 547 nanometers.

A peak wavelength of the transmission spectrum of the red color resist 1111 is greater than 600 nanometers.

A transmittance of the color resist 111 ranges from 44.3% to 65%, and a half-width of the color resist 111 is less than 150 nanometers. Specifically, a transmittance of the blue color resist 1113 ranges from 44.3% to 65%, a transmittance of the green color resist 1112 ranges from 44.3% to 65%, and a transmittance of the red color resist 1111 ranges from 44.3% to 65%.

Please refer to FIG. 1, it should be noted that, in the prior art, in the display panel 10 provided with the polarizer, since the light emitted by the organic light-emitting layer 80 except for the polarizer has a transmittance close to 100% in each layer of the display panel 10. Therefore, in the prior art, the transmittance of the display panel 10 depends on the polarizer. According to the prior art, a product of the power consumption TPOL of the polarizer is a constant K. However, in this embodiment, the color film layer 110 is used to replace the polarizer in the current display panel 10. Since in this embodiment, except for the color resist 111 of the color film layer 110, the light emitted by the organic light-emitting layer 80 has a transmittance close to 100% in each film layer of the display panel 10. Therefore, in this embodiment, the transmittance of the display panel depends on the transmittance of the color resist 111. Therefore, a product of the power consumption $P_{POL-less}$ of the display panel 10 and a transmittance $T_{POL-less}$ of the color resist 111 is a constant K, that is, $P_{POL}*T_{POL}=P_{POL-less}*T_{POL-less}$.

In summary, it can be seen from a formula $P_{POL}*T_{POL}=P_{POL-less}*T_{POL-less}$, in this embodiment, the transmittance $T_{POL}$ of the color resist 111 is inversely proportional to the power consumption $P_{POL-less}$ of the display panel 10. That is, the greater the transmittance $T_{POL}$ of the color resist 111 is, the less the power consumption $P_{POL-less}$ of the display panel 10.

In the prior art, the transmittance $T_{POL}$ of the polarizer relative to the organic light-emitting layer 80 is 44.3%. In order to reduce a power consumption of the display panel 10, this embodiment sets $P_{POL-less}$ to be less than (1-32%) $P_{POL}$. In summary, in order to ensure low power consumption of the display panel 10 and increase the transmittance of the display panel 10, the transmittance of the color resist 111 in this embodiment ranges from 44.3% to 65%. Preferably, the transmittance of the color resist 111 is 58%.

It should be noted that in this embodiment, $P_{POL-less}$ is set to be less than (1-32%) $P_{POL}$, that is, the power consumption of the display panel 10 provided with the color film layer 110 is reduced by 32% compared with the power consumption of the display panel provided with a polarizer is only used as an example. In this embodiment, the above-mentioned numerical value can be selected according to actual conditions.

It can be understood that the greater the transmittance of the color resist 111, the greater the reflectivity of the color resist 111 will increase, resulting in an increase in the reflectivity of the display panel 10. The external light will be specular reflected on the color resist 111 when external light irradiates the color film layer 110, therefore the light reflected by the color resist 111 will interact with the organic light-emitting unit when the display panel 10 displays (that is, when the organic light-emitting layer 80 emits light), thereby the light emitted by the organic light-emitting unit 800 is mixed, causing a color shift phenomenon.

Figure 7:
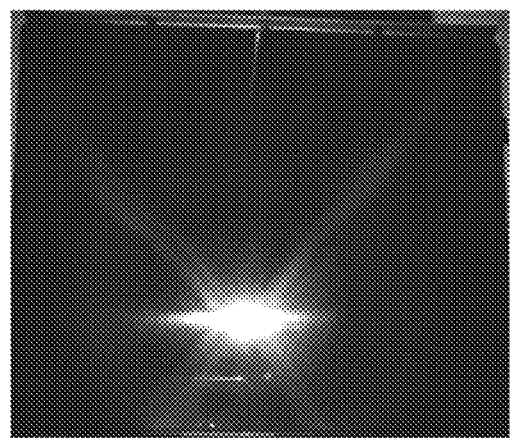
FIG. 7 is a diagram of a color separation phenomenon of the display panel when the transmittance of the color resist is 66% according to one embodiment of the present application.
Figure 8:
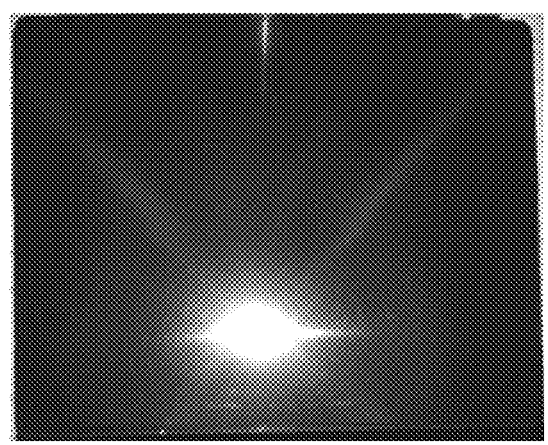
FIG. 8 is a diagram of the color separation phenomenon of the display panel when the transmittance of the color resist is 55% according to one embodiment of the present application.

Please combine FIG. 7 and FIG. 8, wherein FIG. 7 is a diagram of a color separation phenomenon of the display panel when the transmittance of the color resist is 66% according to one embodiment of the present application, FIG. 8 is a diagram of the color separation phenomenon of the display panel when the transmittance of the color resist is 55% according to one embodiment of the present application.

As shown in FIG. 7, the display panel 10 has a more obvious dispersion phenomenon when the transmittance of the color resist 111 is not in the range of 44.3% to 65%. As shown in FIG. 8, a color separation phenomenon of the display panel 10 is effectively improved when the transmittance of the color resist 111 is in the range of 44.3% to 65%. At the same time, since the transmittance of the color resist 111 is in the range of 44.3% to 65%, therefore, the reflectivity of the color resist 111 is not high, thereby reducing the reflectivity of external light and improving a contrast of the display panel 10.

Figure 9:
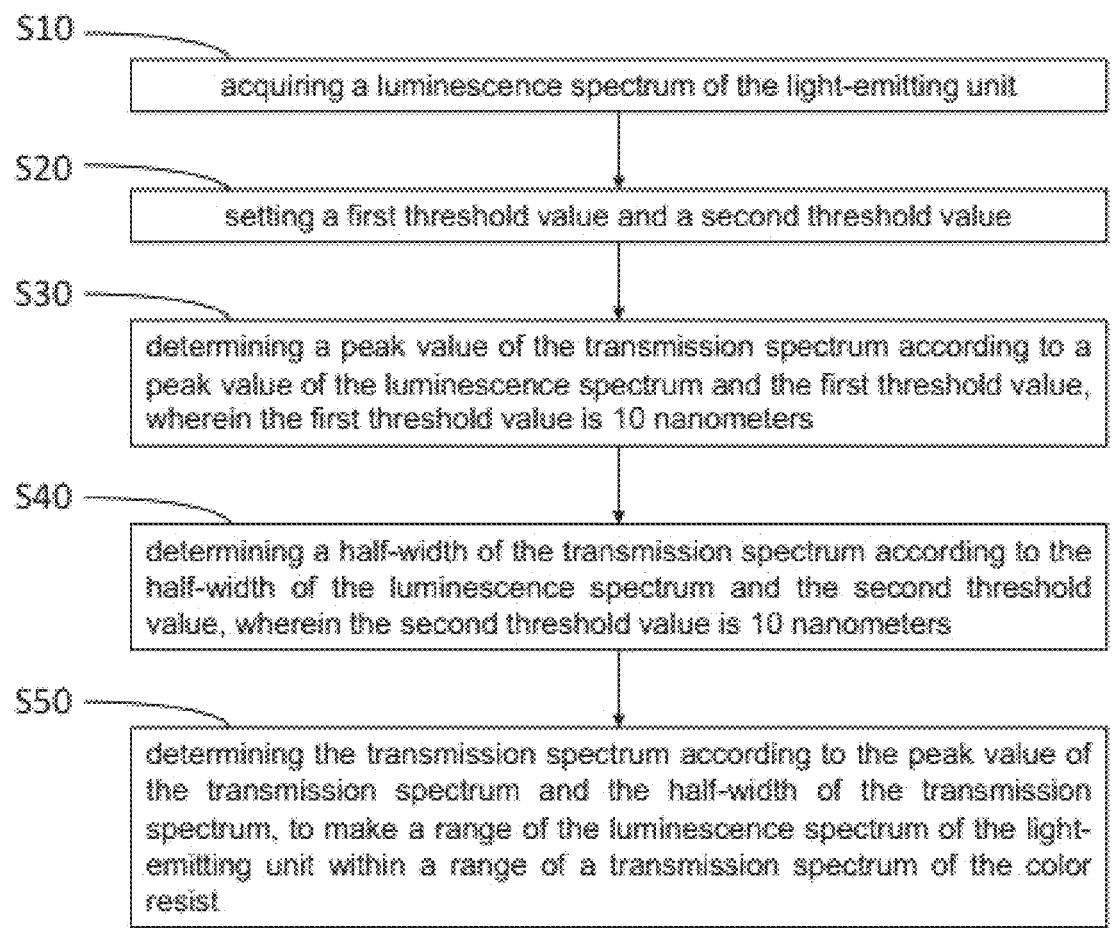
FIG. 9 is a schematic flowchart of an optical adjustment method of a color film layer provided by one embodiment of the present application.

Please combine FIG. 2, FIG. 3, and FIG. 9, wherein FIG. 9 is a schematic flowchart of an optical adjustment method of a color film layer provided by one embodiment of the present application.

This embodiment provides an optical adjustment method of a color film layer, which is applied to a display panel 10. The display panel 10 includes a light-emitting function layer 80. The color film layer 110 is disposed on the light-emitting function layer 80. The light-emitting function layer 80 includes a plurality of light-emitting units 800 arranged at intervals. The color filter layer 110 includes a plurality of color resists 111 arranged at intervals. One of the color resists 111 and one of the light-emitting units 800 are arranged in alignment.

In one of the light-emitting units 800 and a corresponding one of the color resists 111, the optical adjustment method of the color film layer 110 includes the following steps:

Step S10: acquiring a luminescence spectrum of the light-emitting unit 800.

It should be noted that the luminescence spectrum of the light-emitting unit 800 can be directly measured by currently equipment, and this embodiment does not specifically limit the type of equipment used.

Step S20: setting a first threshold value and a second threshold value.

Step S30: determining a peak value of the transmission spectrum according to a peak value of the luminescence spectrum and the first threshold value, wherein the first threshold value is 10 nanometers.

Further, in step S30, an absolute value of a difference between a peak value of a transmission spectrum of the color resist 111 and a peak value of a luminescence spectrum of the corresponding light-emitting unit 800 is less than or equal to 10 nanometers.

Step S40: determining a half-width of the transmission spectrum according to the half-width of the luminescence spectrum and the second threshold value, wherein the second threshold value is 10 nanometers.

Further, in step S40, a difference between the half-width of the transmission spectrum of the color resist 111 and the corresponding half-width of the luminescence spectrum of the light-emitting unit 800 is greater than or equal to 10 nanometers.

Step S50: determining the transmission spectrum according to the peak value of the transmission spectrum and the half-width of the transmission spectrum, to make a range of the luminescence spectrum of the light-emitting unit within a range of the transmission spectrum of the color resist.

It is understandable that in one light-emitting unit 800 and a corresponding one of the color resists 111, the transmission spectrum of the color resist 111 is relatively close to the luminescence spectrum of the corresponding light-emitting unit 800 when a relationship between the transmission spectrum of the color resist 111 and the luminescence spectrum of the corresponding light-emitting unit 800 meets the above-mentioned requirements of the peak value and the half-width, so that most of the light emitted by the organic light-emitting layer 80 can pass through the color film layer 110, thereby improving the luminous efficiency of the display panel 10.

Further, in one of the light-emitting units 800 and the corresponding one of the color resists 111, the optical adjustment method of the color film layer 110 further includes:

Step S60: acquiring a preset rated power consumption of the display panel 10, a reflectivity threshold value of the color resist, and an actual reflectivity value of the light-emitting unit, determining a transmittance of the color resist according to the preset rated power consumption of the display panel 10, the reflectivity threshold value of the color resist, and the actual reflectivity value of the light-emitting unit.

It can be understood that, in the prior art, in the display panel 10 provided with the polarizer, since the light emitted by the organic light-emitting layer 80 except for the polarizer has a transmittance close to 100% in each layer of the display panel 10. Therefore, in the prior art, the transmittance of the display panel 10 depends on the polarizer. According to the prior art, a product of the power consumption $T_{POL}$ of the polarizer is a constant K. However, in this embodiment, the color film layer 110 is used to replace the polarizer in the current display panel 10. Since in this embodiment, except for the color resist 111 of the color film layer 110, the light emitted by the organic light-emitting layer 80 has a transmittance close to 100% in each film layer of the display panel 10. Therefore, in this embodiment, the transmittance of the display panel 10 depends on the transmittance of the color resist 111. Therefore, a product of the power consumption $P_{POL\text{-}less}$ of the display panel 10 and a transmittance $T_{POL\text{-}less}$ of the color resist 111 is a constant K, that is, $P_{POL}*T_{POL}=P_{POL\text{-}less}*T_{POL\text{-}less}$.

In summary, it can be seen from a formula $P_{POL}*T_{POL}=P_{POL\text{-}less}*T_{POL\text{-}less}$, in this embodiment, the transmittance $T_{POL}$ of the color resist 111 is inversely proportional to the power consumption $P_{POL\text{-}less}$ of the display panel 10. That is, the greater the transmittance $T_{POL}$ of the color resist 111 is, the less the power consumption $P_{POL\text{-}less}$ of the display panel 10. At the same time, the greater the transmittance of the color resist 111 the greater the reflectivity of the color resist 111 will increase, resulting in an increase in the reflectivity of the display panel 10. The external light will be specular reflected on the color resist 111 when external light irradiates the color film layer 110, therefore the light reflected by the color resist 111 will interact with the organic light-emitting unit when the display panel 10 displays (that is, when the organic light-emitting layer 80 emits light), thereby the light emitted by the organic light-emitting unit 800 is mixed, causing color shift.

Therefore, in this embodiment, the transmittance of the color resist is determined according to the preset rated power consumption of the display panel 10, the reflectivity threshold value of the color resist, and the actual reflectivity value of the light-emitting unit.

Specifically, the step S60 includes the following steps:

Step S61: determining a minimum transmittance of the color resist according to the preset rated power consumption of the display panel 10.

In this embodiment, the step S61 includes: determining the minimum transmittance of the color resist according to the following relational expression (1) and relational expression (2):

$$T_1 = \frac{K}{P_1} \quad (1)$$

$$P_1 < M \quad (2)$$

wherein $T_1$ is the minimum transmittance of the color resist 11, K is a constant, $P_1$ is a power consumption of the display panel 10, and M is the preset rated power consumption of the display panel 10.

It should be noted that, according to the foregoing embodiment, the transmittance $T_{POL}$ of the color resist 111 is inversely proportional to the power consumption $P_{POL\text{-}less}$ of the display panel 10. That is, the greater the transmittance $T_{POL}$ of the color resist 111 is, the less the power consumption $P_{POL\text{-}less}$ of the display panel 10. In actual situations, the display panel 10 has a preset rated power consumption. Therefore, in this embodiment, the preset rated power consumption M of the display panel 10 is set to limit a minimum transmittance $T_1$ of the color resist. It is understandable that in this embodiment, an amount of the preset rated power consumption M of the display panel 10 is not specifically limited, and its value can be set according to the actual situation.

Step S62: determining the maximum transmittance of the color resist according to the following relational expression (3), relational expression (4), and relational expression (5):

$$T_3 = \sqrt{\frac{r}{R_1 \cdot S}} \quad (3)$$

$$T_3 = \sqrt{\frac{r}{R_1 \cdot S}} \quad (4)$$

$$T_2 = \frac{\int (F_1 \cdot T_3)}{\int F_1} \quad (5)$$

wherein $T_2$ is the maximum transmittance of the color resist 111, r is a reflectivity of the color resist 111, $R_1$ is an actual reflectivity of the light-emitting unit 800, and $T_3$ is a transmittance of the color resist 111 in a preset wavelength band, S is a human visual function, $R_2$ is the reflectivity threshold value of the color resist 111, and $F_1$ is a luminescence intensity of the preset wavelength band of the light-emitting unit 800.

It should be noted that the luminescence intensity $F_1$ of the preset wavelength band of the luminous unit 800 can be directly measured by currently equipment, and this embodiment does not specifically limit the type of equipment used. The human visual function S refers to that human eye has different sensitivity to light of different wavelengths within a range of 380 nanometers to 780 nanometers, which is also called a visual sensitivity of human eye.

It can be understood that the greater the transmittance of the color resist 111, the greater the reflectivity of the color resist 111 will increase, resulting in an increase in the reflectivity of the display panel 10. The external light will be specular reflected on the color resist 111 when external light irradiates the color film layer 110, therefore the light reflected by the color resist 111 will interact with the organic light-emitting unit when the display panel 10 displays (that is, when the organic light-emitting layer 80 emits light), thereby the light emitted by the organic light-emitting unit 800 is mixed, causing color shift phenomenon.

Therefore, in this embodiment, by limiting the reflectivity threshold value $R_2$ of the color resist 111, the transmittance $T_3$ of the color resist 111 in the preset waveband is obtained. The maximum transmittance $T_2$ of the color resist is calculated from the transmittance $T_3$ of the color resist 111 in the preset waveband and the luminescence intensity $F_1$ of the light-emitting unit 800 in the preset wavelength band.

In this embodiment, the range of the transmittance of the color resist is determined to be 44.3% to 65% according to the minimum transmittance of the color resist 111 and the maximum transmittance of the color resist 111.

It should be noted that in this embodiment, the light-emitting unit 800 includes at least a red light-emitting unit 810, a green light-emitting unit 820, and a blue light-emitting unit 830. The color film layer 110 is positioned above the organic light-emitting layer 80. The color resist 111 is at least includes a red color resist 1111, a green color resist 1112, and a blue color resist 1113, wherein the red color resist 1111 is disposed corresponding to the red light-emitting unit 810, the green color resist 1112 is disposed correspondingly to the light-emitting unit 800, and wherein the blue color resist 1113 is disposed corresponding to the blue light-emitting unit 830. The transmittance range of the red color resist 1111, the green color resist 1112, and the blue color resist 1113 can be calculated by the calculation method described above, which will not be repeated here.

This embodiment also provides a mobile terminal. The mobile terminal includes a terminal body and the display panel described in any of the above embodiments, and the terminal body and the display panel are combined into one body.

It can be understood that the display panel 10 has been described in detail in the foregoing embodiment, and the description will not be repeated here.

In specific applications, the mobile terminal can be a display screen of a device such as a smart phone, a tablet computer, a notebook computer, a smart bracelet, a smart watch, a smart glass, a smart helmet, a desktop computer, a smart TV, or a digital camera, or even can be applied to electronic devices with flexible display screens.

In summary, the present application provides an optical adjustment method of a color film layer and a display panel. The display panel includes a light-emitting function layer and a color film layer disposed on the light-emitting layer. The light-emitting function layer includes a plurality of light-emitting units arranged at intervals. The color film layer includes a plurality of color resists arranged at intervals. One of the color resists and one of the light-emitting units are arranged in alignment. In the present application, in one of the light-emitting units and a corresponding one of the color resists, an absolute value of a difference between a peak value of a transmission spectrum of the color resist and a peak value of a luminescence spectrum of the corresponding light-emitting unit is less than or equal to 10 nanometers, and a difference between a half width of the transmission spectrum of the color resist and a half width of the luminescence spectrum of the corresponding light-emitting unit is greater than or equal to 10 nanometers, so that most of the light emitted by the organic light-emitting layer can pass through the color film layer. Thereby improving a luminous efficiency of the display panel, and improving an optical quality and taste of the display panel.

It can be understood that, for those of ordinary skill in the art, equivalent replacements or changes can be made according to the technical solutions of the present application and its inventive concept, and all these changes or replacements shall fall within a protection scope of the appended claims of the present application.

What is claimed is:

1. A display panel, comprising:
a light-emitting functional layer comprising a plurality of light-emitting units arranged at intervals; and
a color filter layer disposed on the light-emitting function layer, wherein the color filter layer comprises a plurality of color resists arranged at intervals, and wherein the plurality of color resists are disposed respectively opposite to the plurality of light-emitting units;
wherein for one of the light-emitting units and one of the color resists opposite to the one of the light-emitting units, an absolute value of a difference between a peak value of a transmission spectrum of the color resist and a peak value of a luminescence spectrum of the light-emitting unit is less than or equal to 10 nanometers, and a difference between a full width at half maximum of a transmission spectrum of the color resist and a full width at half maximum of the luminescence spectrum of the light-emitting unit is greater than or equal to 10 nanometers.

2. The display panel according to claim 1, wherein the light-emitting functional layer comprises a red light-emitting unit, and wherein the color filter layer comprises a red resist arranged in alignment with the red light-emitting unit, and wherein a peak wavelength of the transmission spectrum of the red resist is greater than 600 nanometers.

3. The display panel according to claim 1, wherein the light-emitting function layer comprises a green light-emitting unit, and wherein the color filter layer comprises a green resist arranged in alignment with the green light-emitting unit, and wherein a peak wavelength of the transmission spectrum of the green resist ranges from 507 nanometers to 547 nanometers.

4. The display panel according to claim 1, wherein the light-emitting function layer comprises a blue light-emitting unit, and wherein the color filter layer comprises a blue color resist arranged in alignment with the blue light-emitting unit, and wherein a peak wavelength of the transmission spectrum of the blue color resist ranges from 440 nanometers to 480 nanometers.

5. The display panel according claim 1, wherein a transmittance of the color resist ranges from 44.3% to 65%.

6. The display panel according to claim 5, wherein the transmittance of the color resist is 58%.

7. The display panel according to claim 1, wherein a full width at half maximum of the color resist is less than 150 nanometers.

8. A mobile terminal, wherein the mobile terminal comprises a terminal body and a display panel, and wherein the terminal body and the display panel are combined into one body, and wherein the display panel comprises:
a light-emitting functional layer comprising a plurality of light-emitting units arranged at intervals; and a color filter layer disposed on the light-emitting function layer, wherein the color filter layer comprises a plurality of color resists arranged at intervals, and wherein the plurality of color resists are disposed respectively opposite to the plurality of light-emitting units;

wherein for one of the light-emitting units and one of the color resists opposite to the one of the light-emitting units, an absolute value of a difference between a peak value of a transmission spectrum of the color resist and a peak value of a luminescence spectrum of the light-emitting unit is less than or equal to 10 nanometers, and a difference between a full width at half maximum of a transmission spectrum of the color resist and a full width at half maximum of the luminescence spectrum of the corresponding light-emitting unit is greater than or equal to 10 nanometers.

9. The mobile terminal according to claim 8, wherein the light-emitting functional layer comprises a red light-emitting unit, and wherein the color filter layer comprises a red resist arranged in alignment with the red light-emitting unit, and wherein a peak wavelength of the transmission spectrum of the red resist is greater than 600 nanometers.

10. The mobile terminal according to claim 8, wherein the light-emitting function layer comprises a green light-emitting unit, and wherein the color filter layer comprises a green resist arranged in alignment with the green light-emitting unit, and wherein a peak wavelength of the transmission spectrum of the green resist ranges from 507 nanometers to 547 nanometers.

11. The mobile terminal according to claim 8, wherein the light-emitting function layer comprises a blue light-emitting unit, and wherein the color filter layer comprises a blue color resist arranged in alignment with the blue light-emitting unit, and wherein a peak wavelength of the transmission spectrum of the blue color resist ranges from 440 nanometers to 480 nanometers.

12. The mobile terminal according to claim 8, wherein a transmittance of the color resist ranges from 44.3% to 65%.

13. The mobile terminal according to claim 12, wherein the transmittance of the color resist is 58%.

14. The mobile terminal of claim 8, wherein a full width at half maximum of the color resist is less than 150 nanometers.

* * * * *